(12) United States Patent
Brown et al.

(10) Patent No.: US 7,189,103 B1
(45) Date of Patent: Mar. 13, 2007

(54) WIRE COMB OVERLYING SPARK GAP

(75) Inventors: Steven F. Brown, Huntsville, AL (US); Robert V. Seifert, Jr., Redmond, WA (US); Philip M. Kirshtein, New Market, AL (US)

(73) Assignee: Avocent Corporation, Huntsville, AL (US)

( * ) Notice: Subject to any disclaimer, the term of this patent is extended or adjusted under 35 U.S.C. 154(b) by 0 days.

(21) Appl. No.: 11/295,441

(22) Filed: Dec. 7, 2005

(51) Int. Cl.
*H01R 12/24* (2006.01)
(52) U.S. Cl. ............... 439/493; 439/55; 439/942
(58) Field of Classification Search ........ 439/493, 439/55, 942
See application file for complete search history.

(56) References Cited

U.S. PATENT DOCUMENTS 5,364,292 A * 11/1994 Bethurum .......... 439/610
6,097,613 A * 8/2000 Batten et al. .......... 361/816
6,259,027 B1 * 7/2001 Watanabe .......... 174/72 A
6,603,077 B2 * 8/2003 Hirai .......... 174/78
6,786,758 B2 * 9/2004 Chen et al. .......... 439/449
6,857,898 B2 * 2/2005 Engquist et al. .......... 439/493
6,984,150 B2 * 1/2006 Kondou et al. .......... 439/606
2006/0009048 A1 1/2006 Hsieh

* cited by examiner

*Primary Examiner*—Michael C. Zarroli
(74) *Attorney, Agent, or Firm*—Davidson Berquist Jackson & Gowdey LL

(57) ABSTRACT

An approach is provided for mounting individual wires from multi-wire cables onto circuit boards. A wire comb is mounted adjacent one or more ends of the circuit board to permit a way to space apart individual wires, to hold them in place; and to permit welding or soldering of the wires to the appropriate connections or the circuit board during an overmolding process.

12 Claims, 18 Drawing Sheets

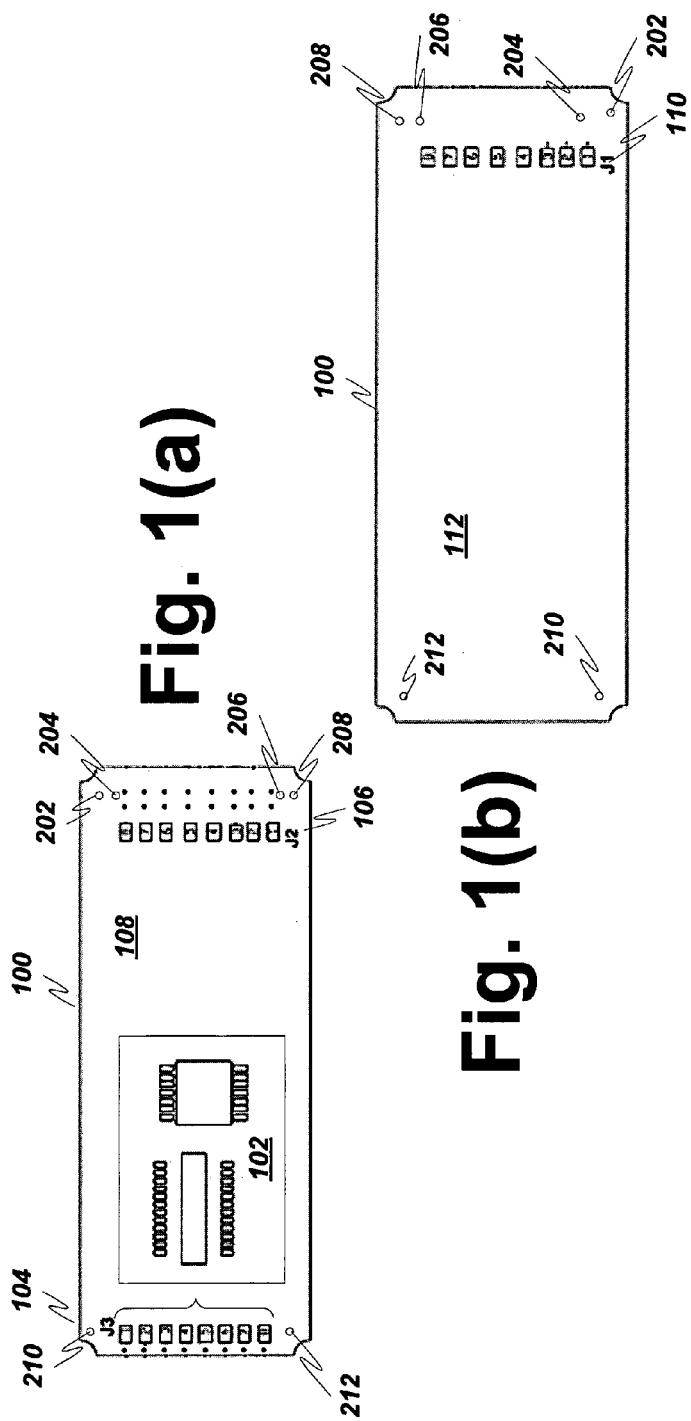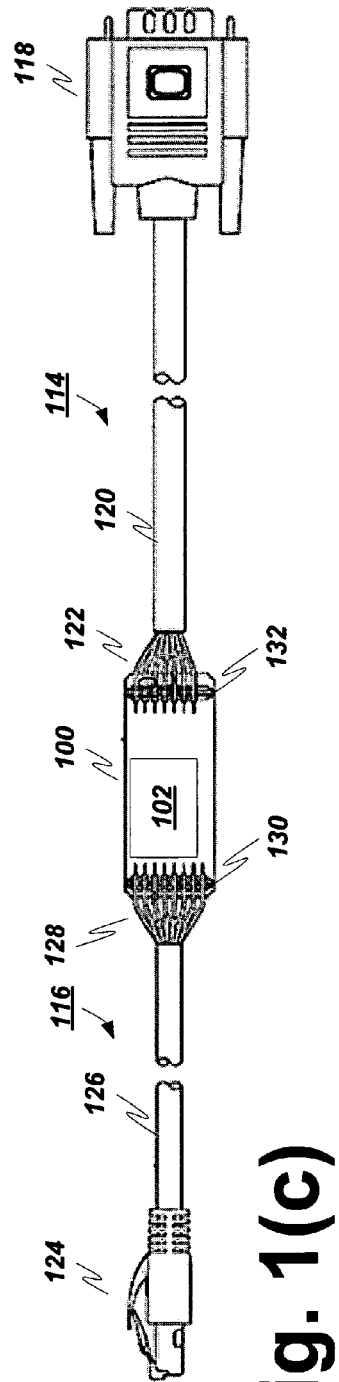

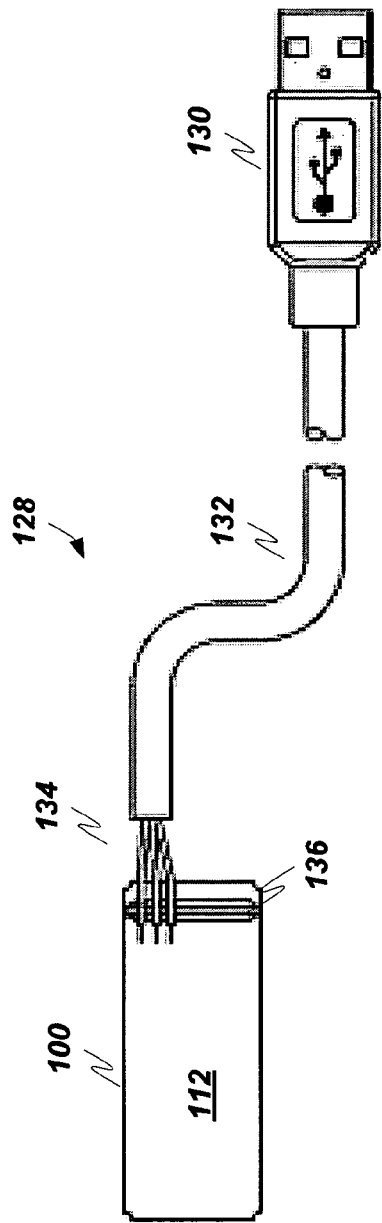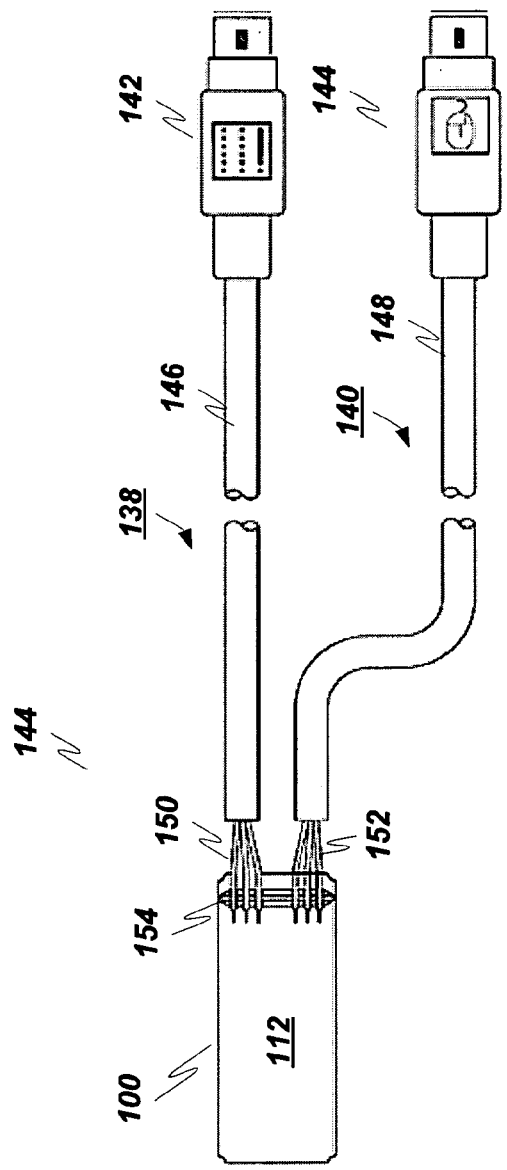
Fig. 2(a)
Fig. 2(b)

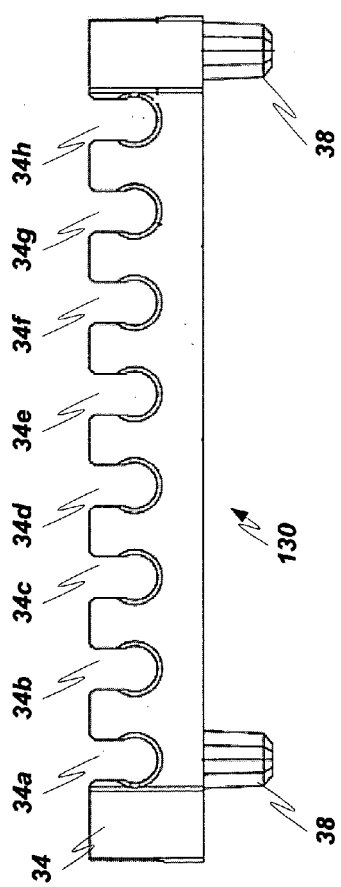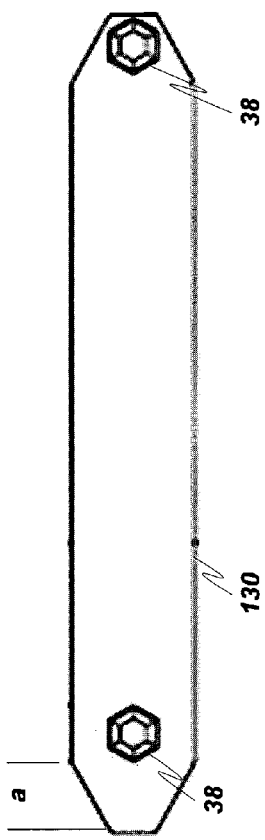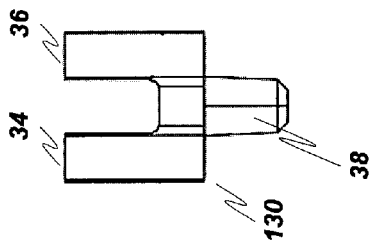
Fig. 6(a)
Fig. 6(b)
Fig. 6(c)

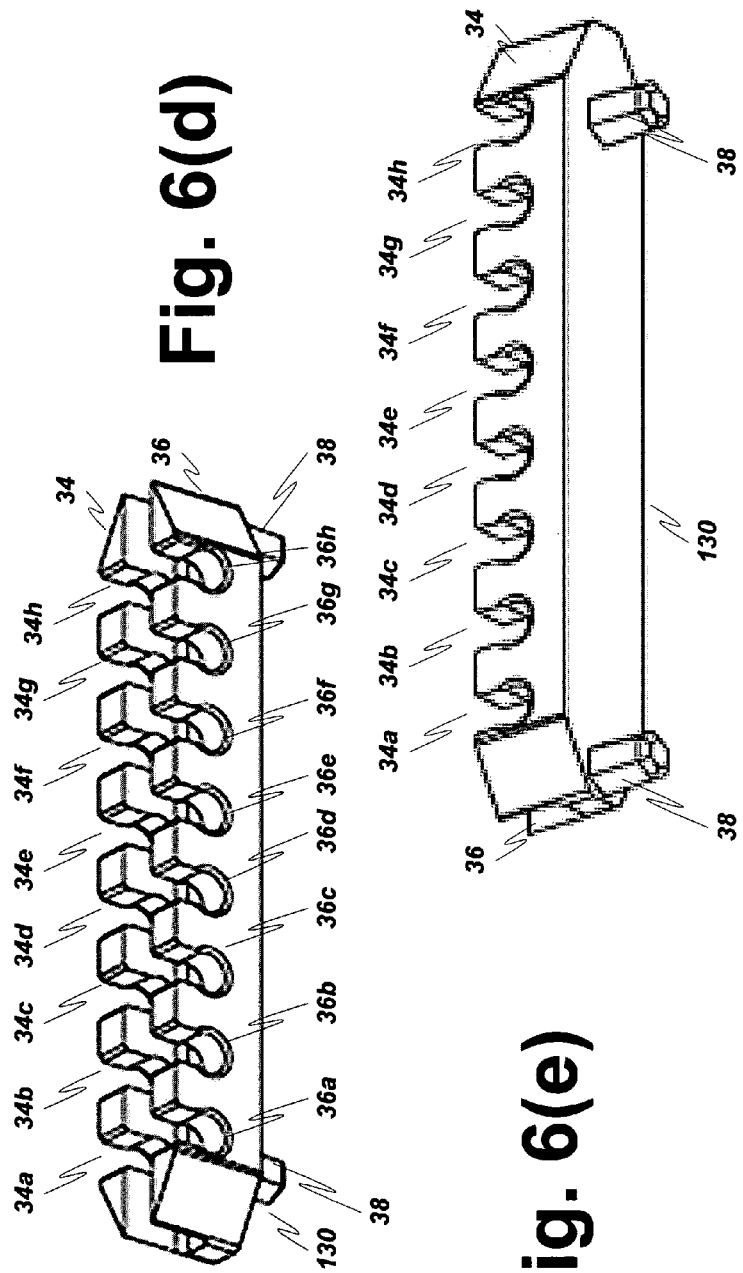
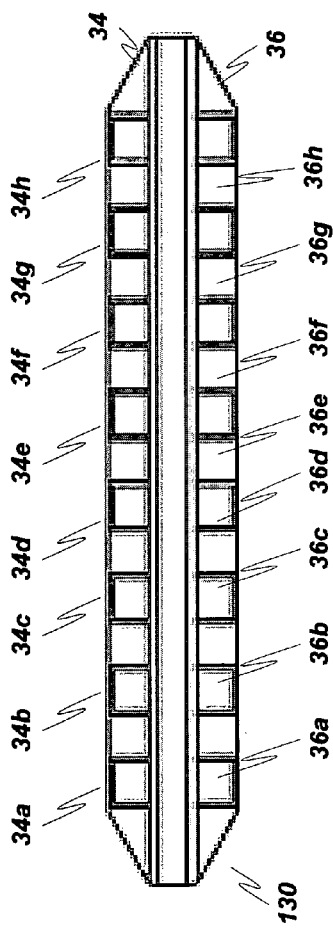

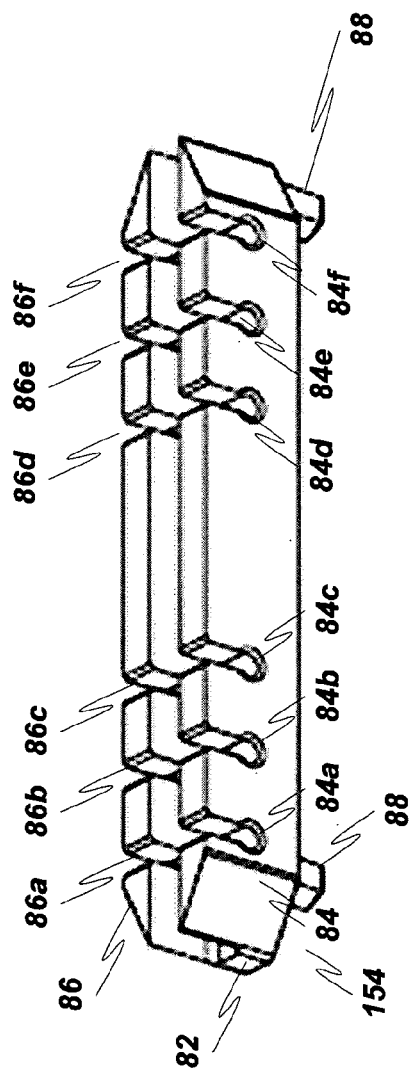
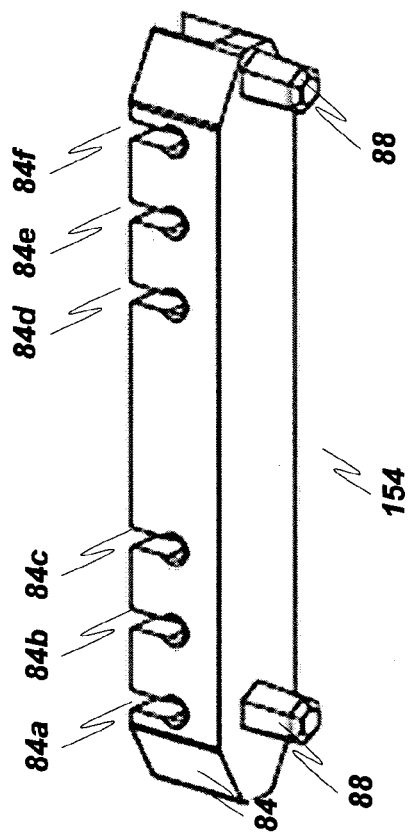
Fig. 7(a)
Fig. 7(b)

FAST DRY ADHESIVE ALONG TOP OF COMB TO SECURE CONDUCTORS.

1mm+0-1mm REF.FLUSH

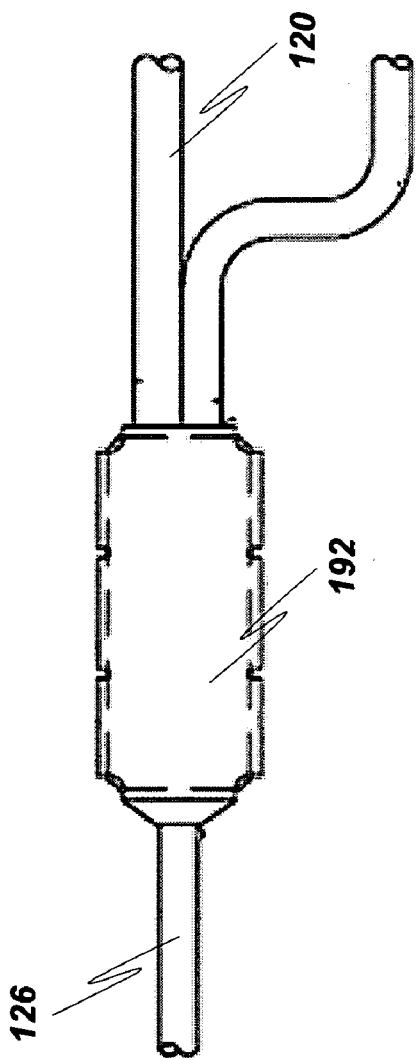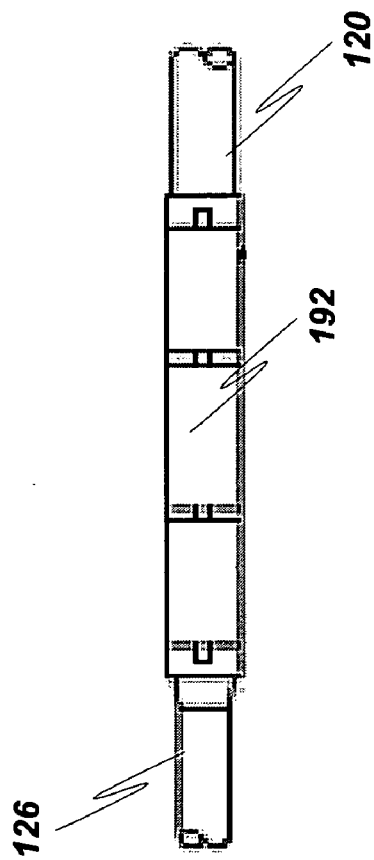

WIRE COMB OVERLYING SPARK GAP

FIELD OF THE INVENTION

The invention relates connecting wires to circuit boards.

DESCRIPTION OF THE INVENTION, AND OF THE MANNER AND PROCESS OF MAKING AND USING IT

BRIEF DESCRIPTION OF THE DRAWINGS

The present invention, its objectives and advantages will become more apparent from the following detailed description when read in conjunction with the accompanying drawings in which:

FIGS. 1(a)–1(b) are plan views of a circuit board according to embodiments of the present invention;

FIG. 1(c) is a top plan view of a VGA connector, corresponding cables, and the wire mount of the present invention;

FIGS. 2(a)–2(b) are plan views of USB and PS/2 cable assemblies and wire mounts according to embodiments of the present invention;

FIGS. 4(a)–4(f), 5(a)–5(f), 6(a)–6(f) and 7(a)–7(d) are various views of wire combs according to various embodiments of the present invention;

FIG. 8(b) is a perspective view of a bottom surface of a circuit board with a wire comb mounted adjacent each end thereof, according to embodiments of the present invention;

FIGS. 10(a)–10(d) show various stages and views of an overmolded circuit board according to embodiments of the present invention.

BACKGROUND

Figure 3:
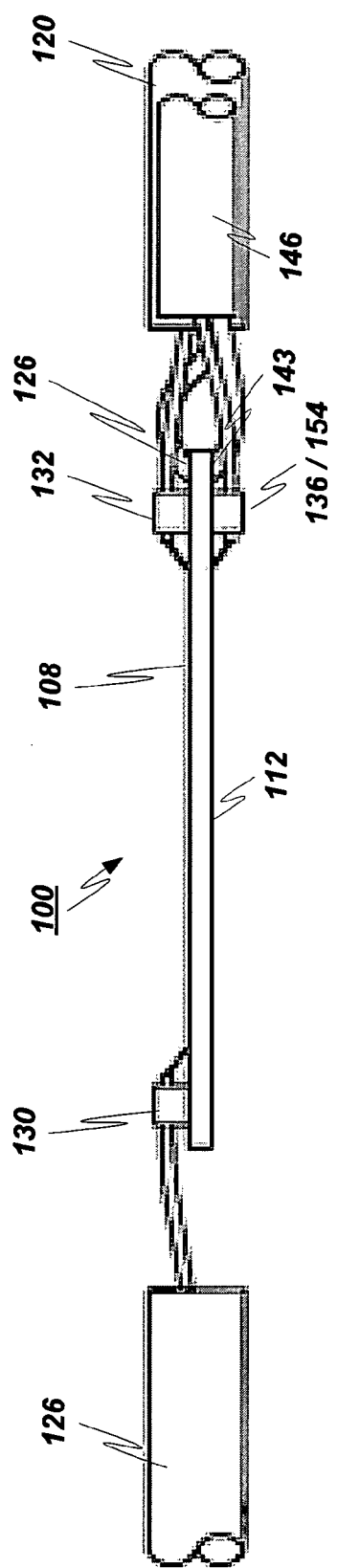
FIG. 3 is a side elevational view of a portion of FIG. 2(a) or FIG. 2(b)

Computer connection cables may include so-called inline circuitry to perform various functions on the signals being transmitted. By "inline circuitry" (or "inline circuits") we mean any electronic circuitry (possibly on a printed circuit board—PCB) that may be incorporated in a computer cable, regardless of the cable's or circuitry's function. For example, U.S. patent application Ser. No. 09/951,774, entitled "Passive video multiplexing method and apparatus," the contents of which are incorporated herein by reference, describes a so-called Rack Interface Pod (RIP) which is provided for receiving video signals from a server computer and providing them to a remote user via a local area network (LAN), preferably an Ethernet LAN. Similarly, U.S. patent application Ser. No. 11/123,075, titled "Computer interface module," and filed May 6, 2005, the contents of which are incorporated herein by reference, describes RIPs and related circuitry.

It is generally desirable that inline circuits (and the corresponding inline PCBs on which they are mounted) be small. This allows for so-called "lump in the cable" designs, where the inline circuit is formed integral with the cable, appearing as a bulge or lump in the cable. An example of such a circuit can be seen, e.g., in FIG. 24 of U.S. patent application Ser. No. 11/123,075, which illustrates a Rack Interface Pod (RIP) device having two network connectors located in the main body and integral therewith. In order to achieve a lump/bulge in cable effect, inline PCBs are preferably formed by molding an appropriate material over them after the wires have been connected to the PCBs.

The inventors realized that the size of inline PCBs made their manufacture difficult. In particular, the inventors noticed that the size of the PCBs generally meant that the wire connection locations or contacts on the PCBs were close together. This closeness of the contacts increases the risk of wires from one contact touching an adjacent contact. The inventors further realized that this risk was increased by the overmolding process used to create the desired inline effect.

When connecting a cable containing twisted pairs to a PCB, it is necessary to untwist an end portion of the wires. The inventors also realized that, especially in the case of twisted pairs, it is desirable to keep the length of the untwisted wires to a minimum. This requirement is made more difficult by small (e.g., inline) PCBs.

Additionally, in the case of inline PCBs, since the wires may, by their very nature, be moved about and possibly pulled, there is increased risk of the wires disconnecting from the PCBs.

DESCRIPTION

Embodiments of the invention will now be described in connection with a number of exemplary cable systems. The examples given use an inline circuit mounted in a known manner on a PCB. Those skilled in the art will realize that the invention is not limited to the exemplary systems or circuits shown. The examples describe the use of CAT 5 (Category 5) cables. As is well known, CAT 5 cables consist of four twisted pairs of copper wire supporting frequencies up to 100 MHz and speeds up to 1000 Mbps. Again it will be clear to those skilled in the art that the invention is not limited to CAT 5 or any other type or category of cable.

FIGS. 1(a)–1(b) show top and bottom plan views, respectively, of a PCB 100 having electronic circuitry (generally denoted 102) mounted thereon in a known manner. As noted, the function of the circuits 102 should not be considered to limit the scope of the invention. However, in some presently preferred embodiments of the invention, the PCB is to be connected inline in a cable system to be used in a KVM system and the circuitry 102 performs appropriate KVM functions such those disclosed in U.S. application Ser. No. 09/951,774, incorporated herein by reference.

In order to facilitate external electronic connection to the circuitry 102 thereon, the PCB 100 includes a number of electrical contacts 104 (also denoted "J3"), 106 (also denoted "J2") (on a first surface 108 thereof) and 110 (also denoted "J1") (on a second surface 112 thereof). For convenience, the first surface 108 is referred to herein as the "top" surface and the second surface 112 is referred to as the "bottom" surface. In the example shown, reference 104 refers collectively to the eight contacts on the left side of the PCB in FIG. 1(a), reference 106 refers collectively to the eight contacts on the right side of the PCB as shown in FIG. 1(a), and reference 110 refers collectively to the eight contacts on the bottom surface of the PCB, as shown in FIG. 1(b).

FIG. 1(c) shows a plan view of a VGA cable assembly 104, the top plan view of a PCB 100 and a cable assembly 116 (e.g., a CAT 5 cable). The VGA cable assembly 104 includes a plug 118, cable 120 and a pig tail 122 that includes individual wires (seven in this example) that have been spread or fanned out.

The second cable assembly 116, for example, includes a plug 124 (e.g., a standard RJ-45 connector), cable 126 and a pig tail 128 including, in this case, eight individual wires that have been fanned out. Wire combs 130 and 132 are shown mounted adjacent opposite ends of the circuit board 100, and each comb 130 and 132 holds a respective group of individual wires, in this example seven (7) and eight (8), respectively.

Wires in the cable 126, preferably a CAT 5 cable, electronically connect the circuits 102 on the PCB 100 to the first connector 124, in this case a standard RJ-45 connector. Wires in the second cable 120, a shielded 5 cable, electronically connect the circuits 102 via contacts 106 on the PCB 100 to a video connector 118, in this example a VGA connector.

As shown in FIGS. 1(a)–1(c), on the upper or top surface 108 of the PCB 100, some or all of the wires from the first cable 126 each connect to different ones of the eight contacts 104 and to the connector 124. Similarly, some or all of the wires from the second cable 120 connect to the contacts 106.

FIGS. 2(a)–2(b) show bottom plan views of the cable assembly shown in FIGS. 1(a)–1(c). FIG. 2(a) shows a USB cable assembly 128 that includes a USB connector plug 130, cable 132 and a pig tail 134 of three individual wires that are shown being held by a three-position wire comb 136 that is itself mounted to the bottom surface 112 of circuit board 100. In this exemplary embodiment, wire comb 136 is positioned directly opposite the location of wire comb 132 in FIG. 1(c).

FIG. 2(b) shows an alternative arrangement for the same end of circuit board 100. In this example, the circuit board 100 is connected to PS/2 keyboard and mouse cable assemblies, 138 and 140, respectively, which include their respective connector plugs 142 and 144, their cables 146 and 148. In each cable 146 and 148, the individual wires have been fanned out into pig tails 150 and 152, respectively, and the wires are shown as being held by wire comb 154 on the bottom surface 112 of circuit board PCB 100. Here again, wire comb 154 is located directly opposite wire comb 132 on the same end of circuit board 100. As shown in FIG. 2(b), on the lower surface 112 of the PCB 100, some or all of the wires from each of the mouse cable assembly 140 and the keyboard cable assembly 114 connect to contacts 122.

Figure 8A:
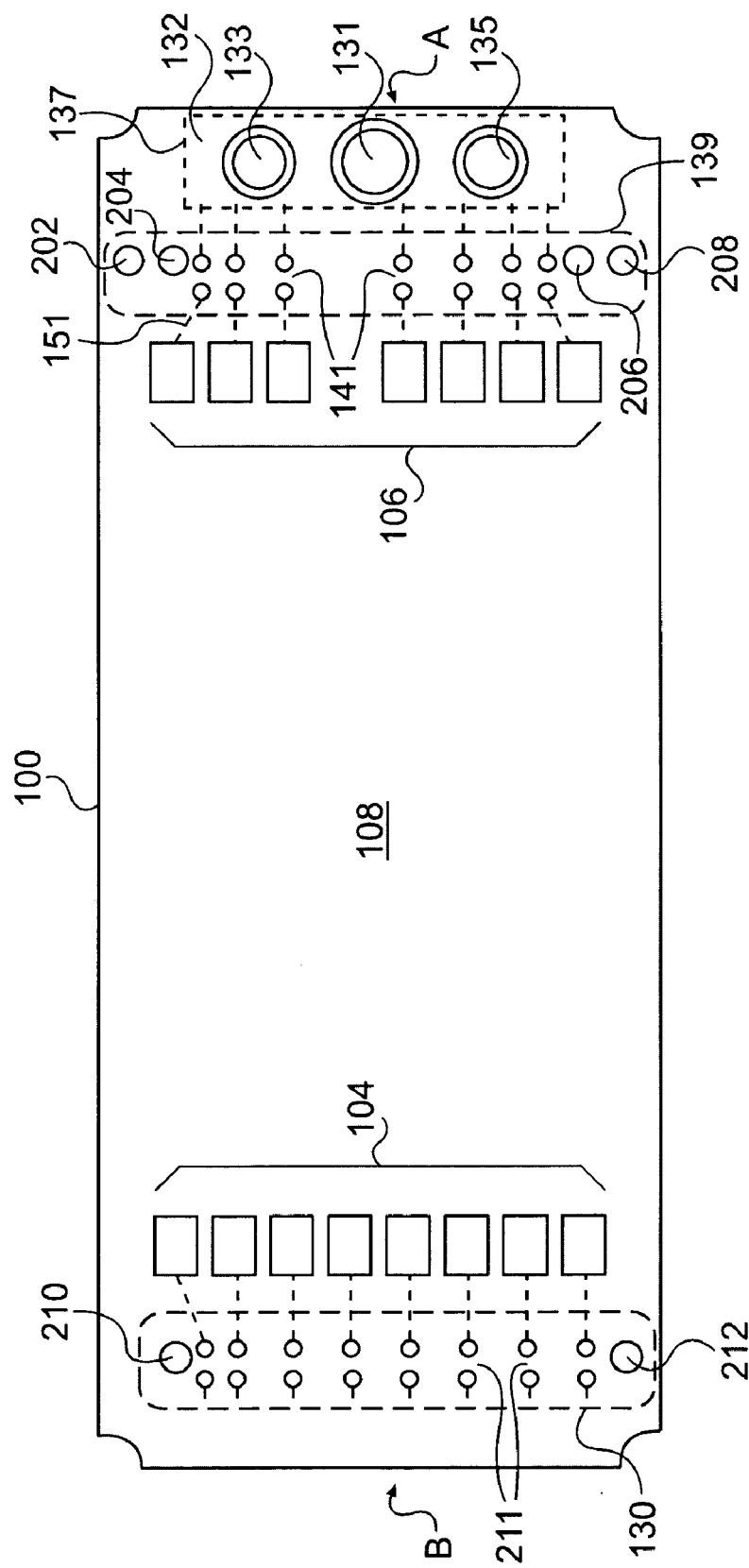
FIG. 8(a) is the top plan of a circuit board according to embodiments of the present invention, prior to mounting wire combs thereon.
Figure 8B:
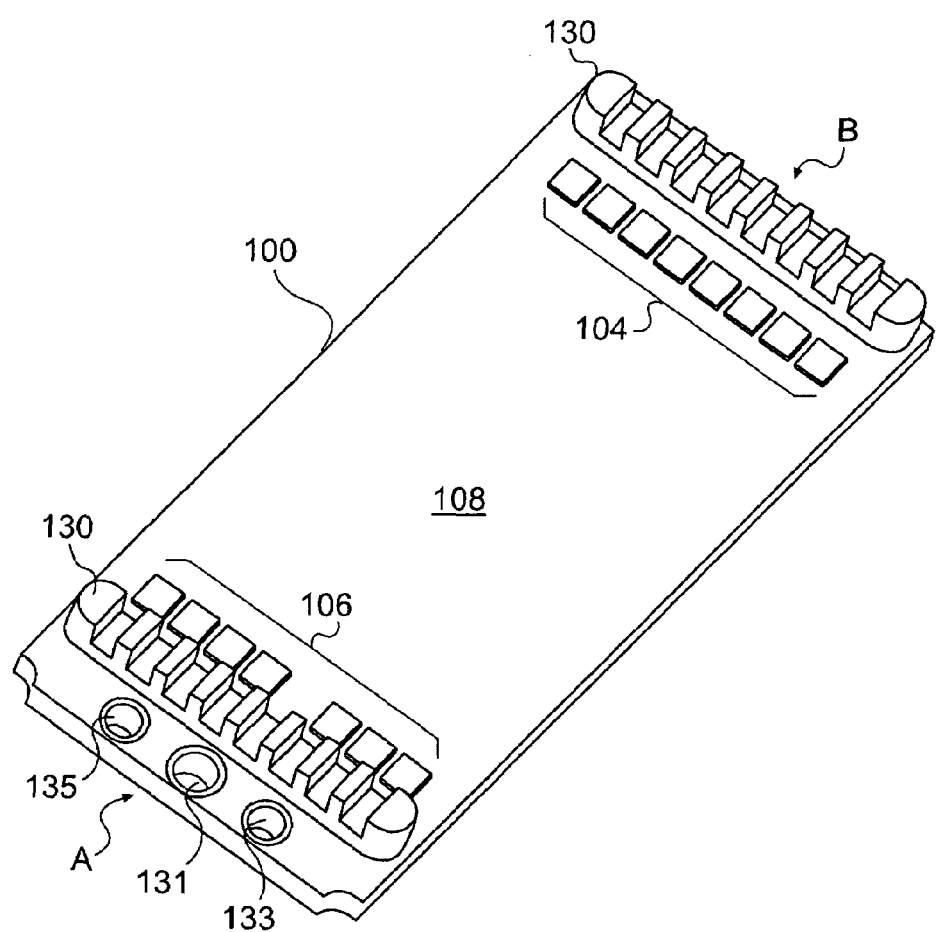
FIG. 8(b) is a perspective view of a top surface of a circuit board with a wire comb mounted adjacent each end thereof, according to embodiments of the present invention.

FIG. 3 shows a side view of circuit board 100 as described above with reference to the embodiments of FIG. 2(b), with a shielded video cable 120, a shielded keyboard cable 146, and a shielded mouse cable 148 being connected at one end of circuit board 100, and cable 126 attached to the other end. This view also shows the relative positions of wire combs 130, 132 and 154 on circuit board 100. In addition, as shown in FIGS. 3, 8(a) and 8(b) the braided grounding shield 121 included within cable 120 can be connected to a ground connector 131, while the braided shield 143 included within cables 146 and 148 can be connected to ground connectors 133 and 135, respectively, to conduct ESD impulses to the chassis ground at the PC. An extended ground shield 137 can also be provided on the circuit board PCB 100 adjacent and around connectors 131, 133 and 135, as shown in FIG. 8(a).

Further, the circuit board includes a plurality of spaced apart ESD spark gaps 141 that can vary in size fro about 0.0035 inch to about 0.040 inch, and with one spark gap being available for each contact pad 106 and they are formed directly on the circuit board PCB 100. Each respective spark gap 141 will have a connection path, as at 139, extending to the ground shield 137, and another, as at 151, extending toward and in contact with one connector pad where ESD discharge protection is required.

The plurality of the spaced apart spark gaps 141 are positioned between the mounting holes 202/204 and 206/208 on the circuit board PCB 100 for wire combs 132 and 134/154, for example. Consequently, the mounting of wire combs 132 and 136/154 on the circuit board PCB 100 will position the flat base 52 of such wire combs so that it overlies the whole row of spark gaps 141. In fact, the spark gaps extend along the center line of the wire combs. Consequently, mounting of wire combs 132 and 136/154 will cause the base 52 to directly overlie the plurality of spark gaps. As mounted, base 52 of wire combs 132 and 136/154 will also fit tightly on the circuit board PCB 100, and in fact base 52 will preferably be flush with the solder mask surrounding the spark gaps 141. That relationship not only forms an effective seal between the surface of circuit board PCB 100 and the bottom of the wire combs, but also forms small chambers at the spark gaps 141 between the surface of the circuit board PCB 100 and the bottom or base 52 of the wire combs 132 and 136/154.

The use of wire combs 132 and 136/154 thereby provides integral protection of these spark gaps 141, and protects them from the molding and over molding materials by preventing the such molding material from filling the space between the circuit board and the bottom of the wire combs. As noted previously, each spark gap 141 resides in the surface of the circuit board PCB 100 at a point below and underneath wire combs 132 and 136/154. The location of the wire combs 132 and 136/154 over spark gaps 141, and the seal it provides, prevents overflowing material from passing beneath the wire combs and prevents that material from covering or encapsulating the spark gaps which would render the spark gaps ineffective. Were that to occur, the overflowing material, for example PE, would alter, by raising, the break down voltage of the spark gap.

The over molding can be accomplished in a two step process beginning with a low temperature, low pressure polyurethane material, PE. That molding step would be followed using and outer molded cover preferably formed from a PVC material that will be used under a higher temperature and a higher pressure. By using wire combs in a flush or tight fitting relationship with the circuit board PCB 100, and a two stage over molding process, the molding material will not flow beneath the wire combs or between the base 52 and the circuit board PCB 100. This provides protection for and the continued effectiveness of spark gaps 141. FIG. 8(a) also shows an additional set of spaced apart spark gaps 211 at the opposite end of the circuit board PCB 100. These too would be protected by the presence of a wire comb mounted there over.

In presently preferred embodiments, each wire comb is comprised of a molded resin or plastic, including, for example, a rigid PVC resin, nylon, HDPE, PVC, ABS, PC or other like materials. In presently preferred embodiments of the invention, each wire comb is about 18.5 mm long and about 2.5 mm wide and about 2.5 mm high. Each mounting pin can be hexagonal in cross-section, although other cross-sectional shapes are included, and each pin has a width of about 1.1 mm between the flat sides and a width of about 1.26 mm at the point, and extends about 1.5 mm below the bottom surface of base of the wire comb.

FIGS. 4(a)–6(f) show a variety of designs or arrangements for the wire combs according to embodiments of the present invention. FIGS. 4(a)–4(d) show a three (3) slot wire comb 136, FIGS. 5(a)–5(f) show a six (6) slot wire comb 154, and FIGS. 6(a)–6(f) show an eight (8) slot wire comb 130. FIGS. 4(a)–4(d) show wire comb 136 as being comprised of a base 52, a pair of upstanding, spaced apart walls 54 and 56, and mounting pins 58 depending from opposing ends of the base 52. Wall 54 includes three wire openings or slots 54a–e, and wall 56 includes a set of three openings or slots 56a–c. The two sets of opening 54a–c and 56a–c are preferably aligned so that an individual wire's insulating coating will be held by each pair of openings, for example 54a and 56a. However, it should be understood that only one wall, for example 54 could be used with its set of openings. This feature is shown in FIG. 4(e), where wall 54 is shown in full line and wall 56 is shown in dotted line, as an indicating that it could be removed. Also, the location of the walls 54 and 56, or only one when that embodiment is used, can be positioned in the center of base 52, on one side or the other, or at some angle, depending on the location of use, the wire configuration and other similar factors. Further, the present invention encompasses the concept of having the openings formed as part of the base 52 where a low profile wire comb is either preferred or needed.

Figure 4A:
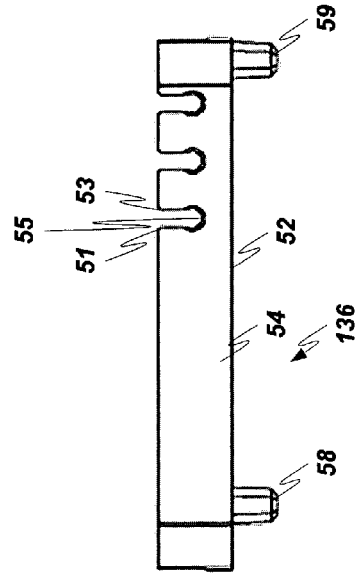
Figure 4B:
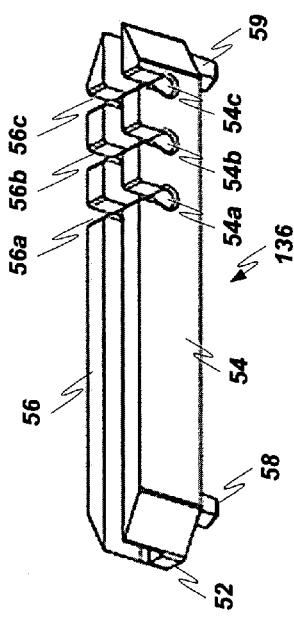
Figure 4C:
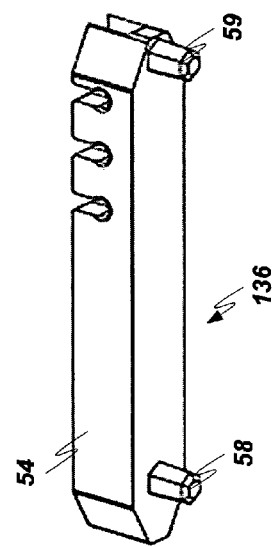
Figure 4D:
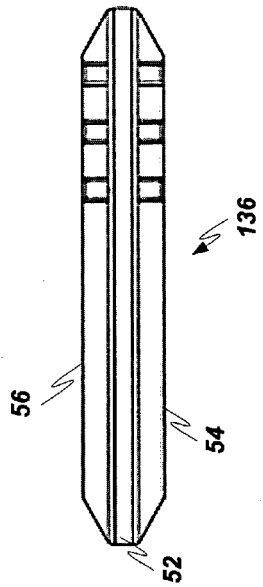
Figure 4E:
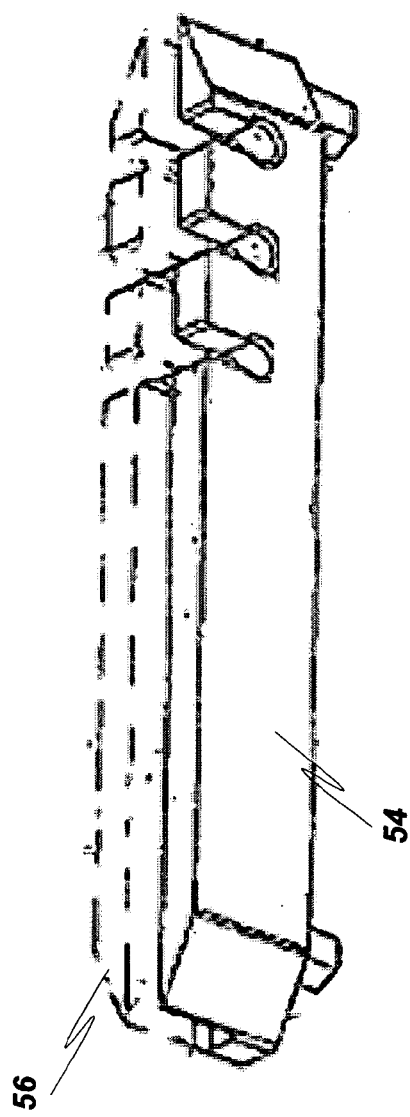

As shown in FIG. 4(b), opening 54a could have an upper portion defined by parallel walls 51 and 53, and a circular or rounded base area 55.

Figure 4F:
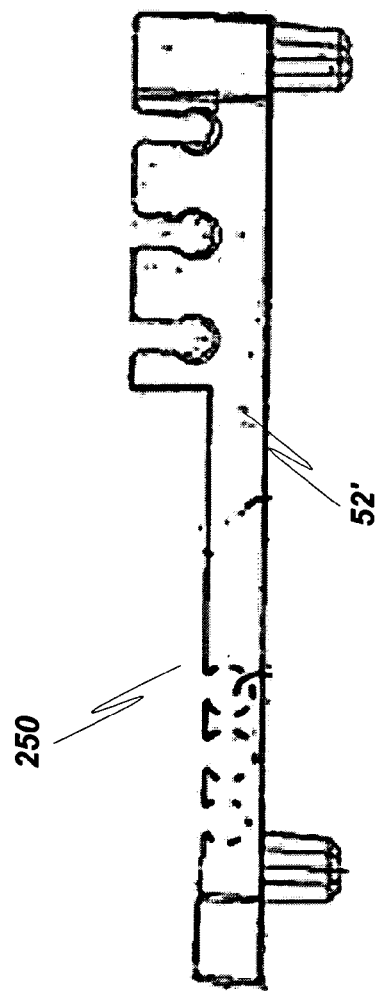
Figure 5A:
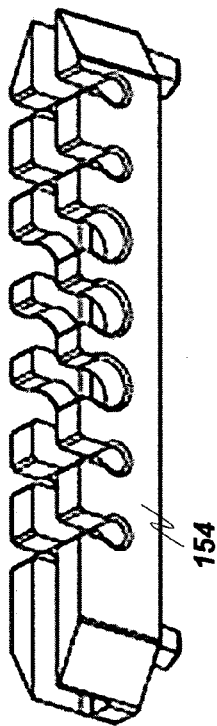
Figure 5B:
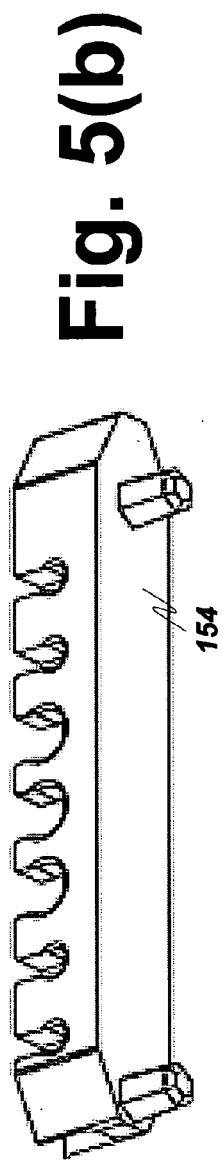
Figure 5C:
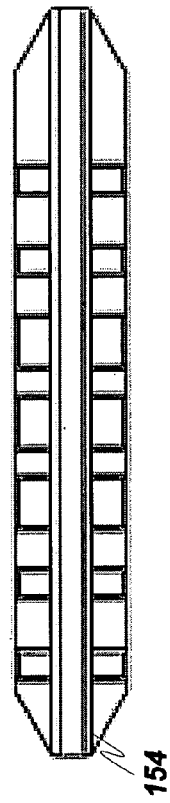
Figure 5D:
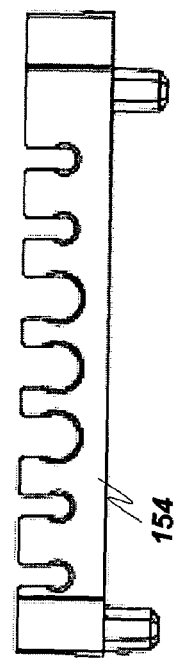
Figure 5E:
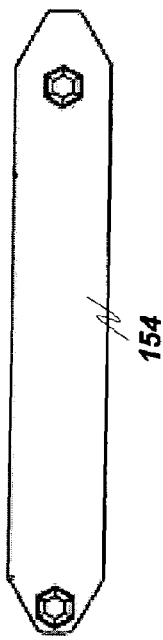
Figure 5F:
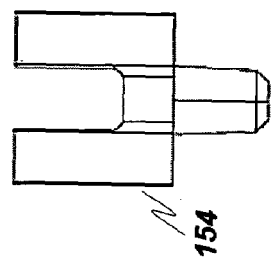
Figure 7C:
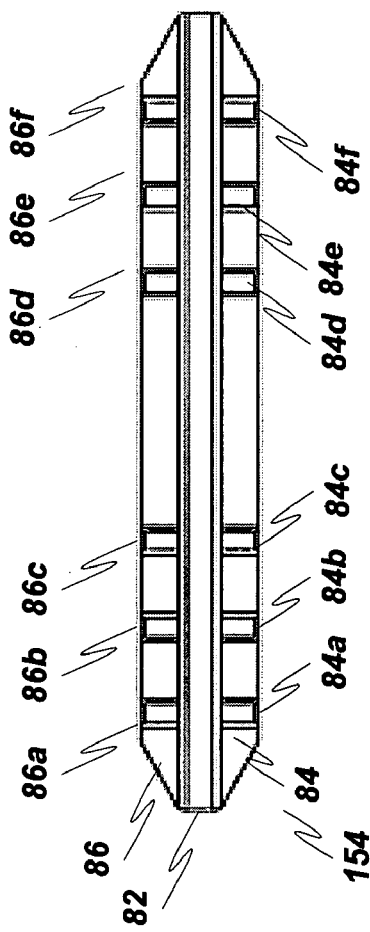
Figure 7D:
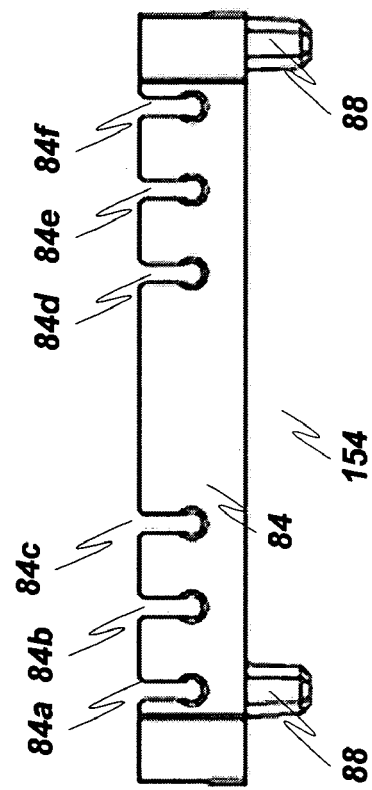

It should be understood, however, that the slots or openings 54a–54c could have other shapes including, for example, extending the parallel wall portions down full length of the opening, or the rounded portion could be modified so as to encompass the and form a top opening into the rounded shape. Further the overall cross sectional shape of the openings could exhibit a v-shaped slot, a u-shaped slot or some other shape so that the individual wire could be held in a desired position. Suitable shaped openings or grooves could also be formed directly in the base itself. An example of this is shown in FIG. 4(f), where such wire openings 250 are formed directly in base 52'.

FIGS. 5(a)–5(f) show an exemplary seven-slot wire comb 154, according to embodiments of the present invention. As can be seen from the drawings, not all the slots are of equal size and not all the slots are equally spaced.

FIGS. 6(a)–6(f) show an exemplary eight slot wire comb 130 with a base 32, according to embodiments of the present invention, upstanding walls 34 and 36 and respective openings 34a–h and 36a–h. Mounting pins 38 extend downward from base 32.

FIGS. 7(a)–7(f) show an exemplary six-slot wire comb 154, according to embodiments of the present invention. The comb 154 is comprised of a base 82, walls 84 and 86, which respectively contain openings 84a–84f and 86a–86f, and mounting pins 88.

FIG. 6(b) is a bottom view of the wire comb 130 and shows, for example, the mounting pins 38, with the left pin being offset by a space (denoted "a") from the leftmost end. In presently preferred embodiments of the present invention, each wire comb 30, 50 and 154, is comprised of a molded resin or plastic, such as a rigid PVC resin. Each wire comb is about 18.5 mm long and about 2.5 mm wide and about 2.5 mm high. Each mounting pin can be hexagonal in cross-section, although other cross-sectional shapes are included, and has a width of about 1.1 mm between the flat sides and a width of about 1.26 mm at the point, and extends about 1.5 mm below the bottom surface of base 32.

The slots referenced herein are preferably each about 1.5 mm in depth and are spaced apart about 2 mm in the three and six slot versions, while the slots in the eight-slot embodiment are spaced apart about 2 mm. The gap between walls (e.g., walls 51 and 53, FIG. 4(b)) can vary from about 0.45 mm to about 0.90 mm. The pins 38 have a spacing of about 15.5 between their center lines, and the distance from the center line of the wire comb to the center line of the left pin 38 in FIG. 6(b) is about 7 mm, and is about 8.5 mm to the center line of the right pin.

With the pin placement as shown and described above, it will understood that two wire combs can be positioned directly over one another on opposite side of a board, with the offset of the pins permitting one of the two combs to be turned 180 degrees.

With reference to FIG. 8(a), four mounting holes 202, 204, 206, and 208 are provided on the right end (denoted "A") of board 100. Two mounting holes 210 and 212 are respectively formed at the opposite end, "B." Wire connection or electrical contact pads, shown at 104 and 106, respectively, are also provided on circuit board 100, along with the desired circuitry (not shown).

Figure 8C:
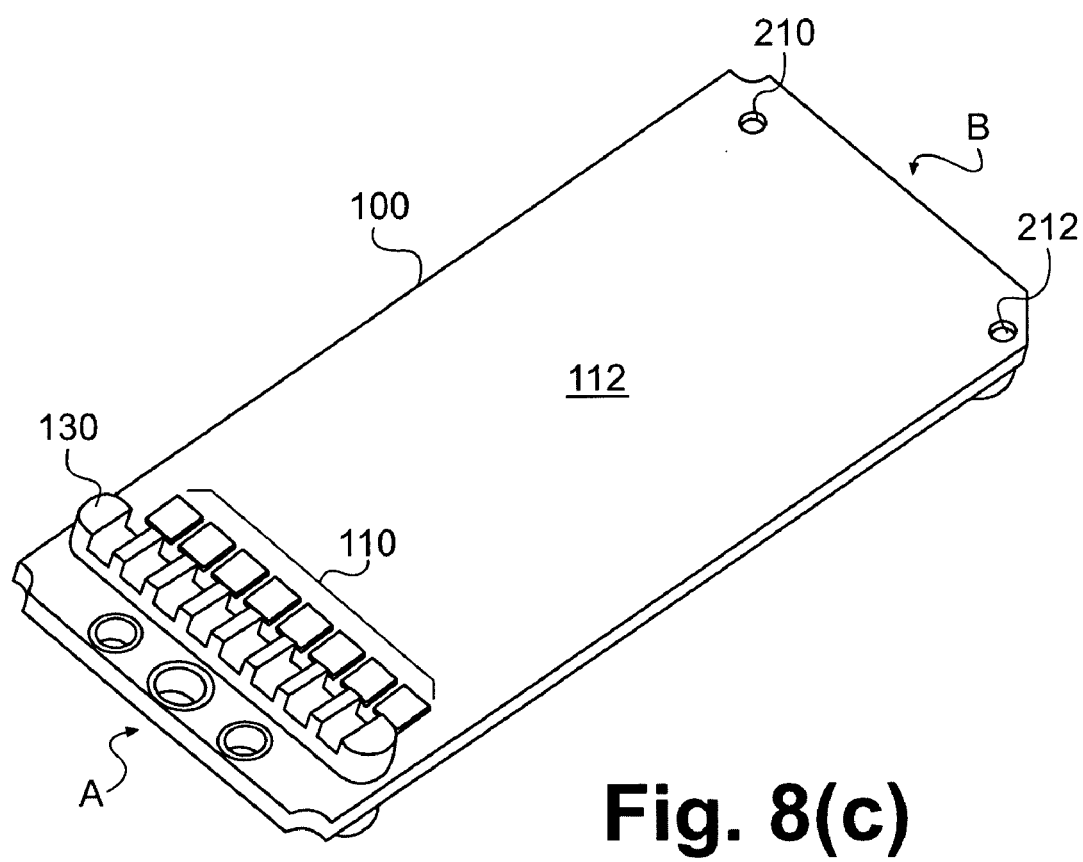

FIGS. 8(b) and 8(c) show three wire combs 130 mounted in place on a circuit board 100. FIG. 8(b) shows the top of circuit board 100, and a wire comb 30 is mounted adjacent each end "A" and "B." FIG. 8(c) shows the bottom of circuit board 100, and another wire comb 30 which is mounted adjacent end "A". At end "A", the top-side wire comb 30 will have its pins 38 mounted within mounting holes 204 and 208, where as the bottom mounted wire comb 30 will have its pins 38 mounted within mounting holes 202 and 206. The third wire comb 30 is mounted adjacent end "B", on the top side of board 100, and its mounting pins 38 will fit in mounting holes 110 and 112. It should be understood that additional sets of mounting holes could be provided at end "B", or wherever else on board 100 it might be desired to employ a wire comb, even along the longer sides or inboard from either or both of the ends.

A method of assembling a cable system according to embodiments of the present invention is now described. The appropriate wire combs 132, 134, 136 are fixedly inserted into the corresponding holes in the PCB 100. Any suitable adhesive can be used to hold the wire combs in place. The adhesive can be a viscous adhesive that cures either through chemical catalytic means, by a photo cure or by solvent evaporation. The preferred adhesive is a thin layer of a low bloom Cyanoacrylate.

Figure 9A:
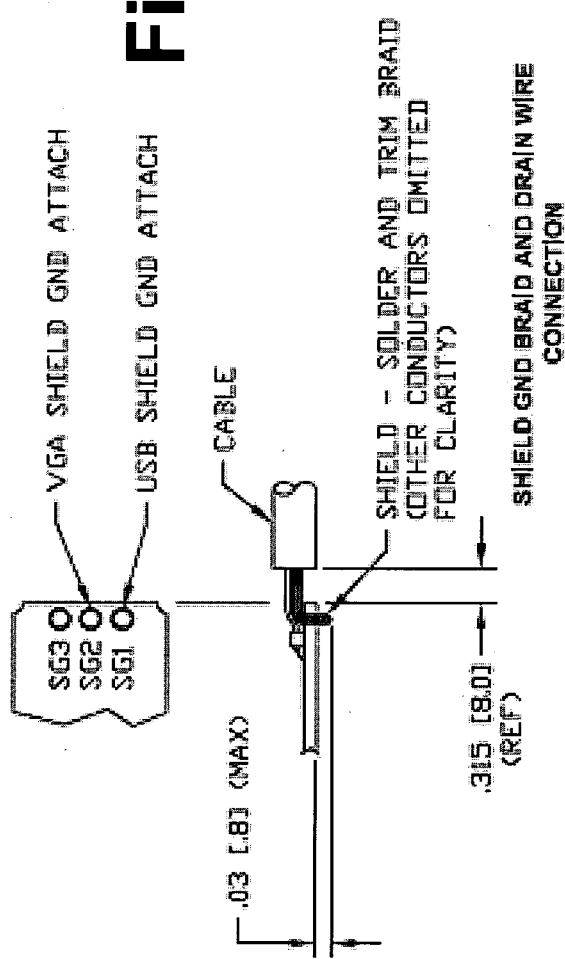
FIGS. 9(a)–9(c) provide detailed views of aspects of the present invention.
Figure 9C:
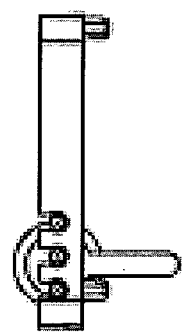
Figure 9B:
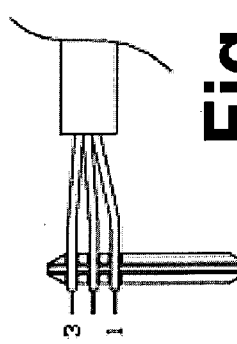
Figure 9D:
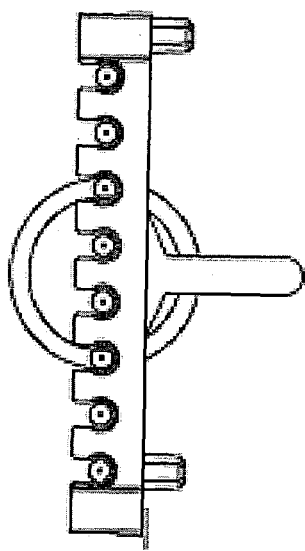
Figure 9E:
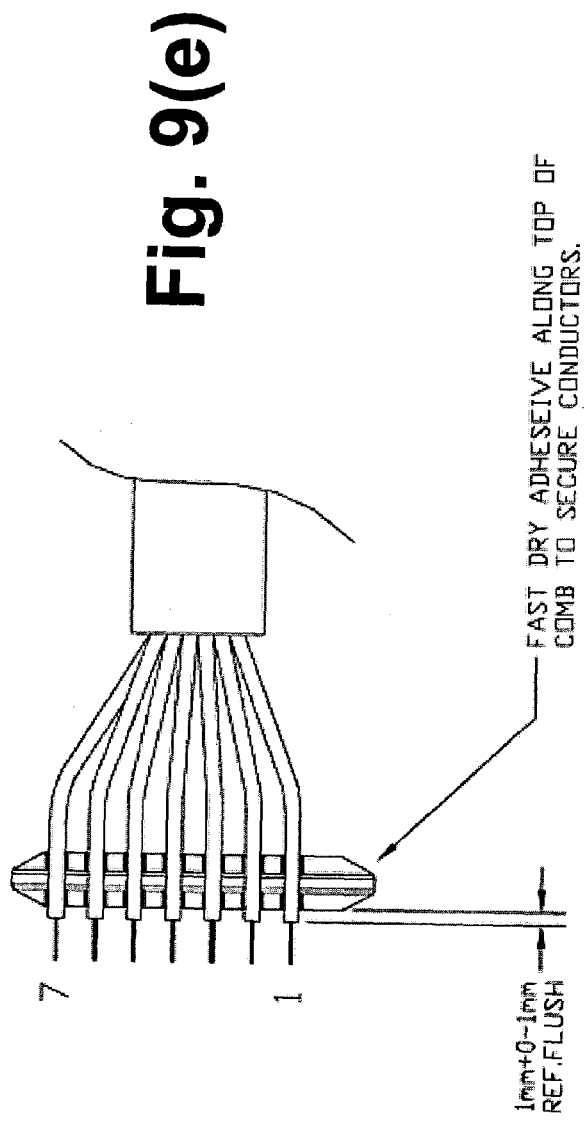

To connect the cable assemblies 112, 114 to the PCB 100, the shield braid 152 from the cables is installed per FIGS. 3 and 9(a). Preferably the cable jacket end should be positioned no more than 8 mm from the board edge. The connection should be soldered and the shield braid should be trimmed as necessary. Shrink insulation may be used as necessary. The wires from the cable assemblies 112, 114 are then positioned in the wire comb 136 according the required connectivity. The wires from cables 104, 108 are similarly connected to the appropriate contacts. Once the various wires are in the appropriate slots of their respective wire combs, a fast dry adhesive as noted above, may be used along the top of the wire comb to secure the conductors. Preferably 100% shielding is maintained on all connectors with copper foil or a metal shell between the connector shell and the cable's braided shield. In a presently preferred embodiment, for use in a KVM system, the coax returns, sync ground, shield and drain wires are stripped and twisted together. Trimming of up to 25% of the shield braid strands is allowed. Strand ends must not be allowed to pierce through conductor insulation. FIGS. 9(b)–9(e) provide detailed views of the wires from cable 108 in wire comb 134.

Figure 10C:
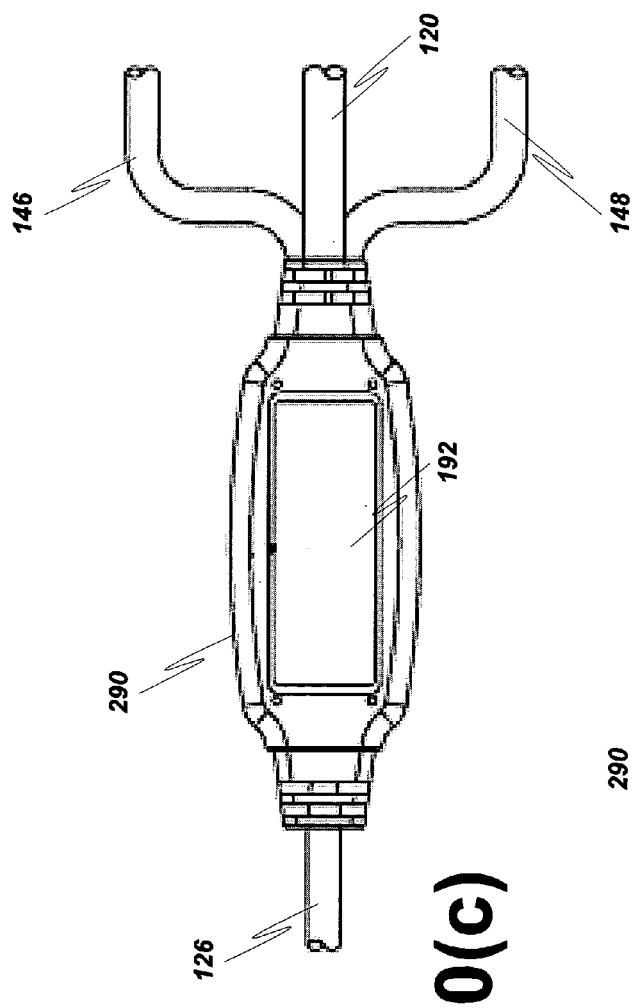
Figure 10D:
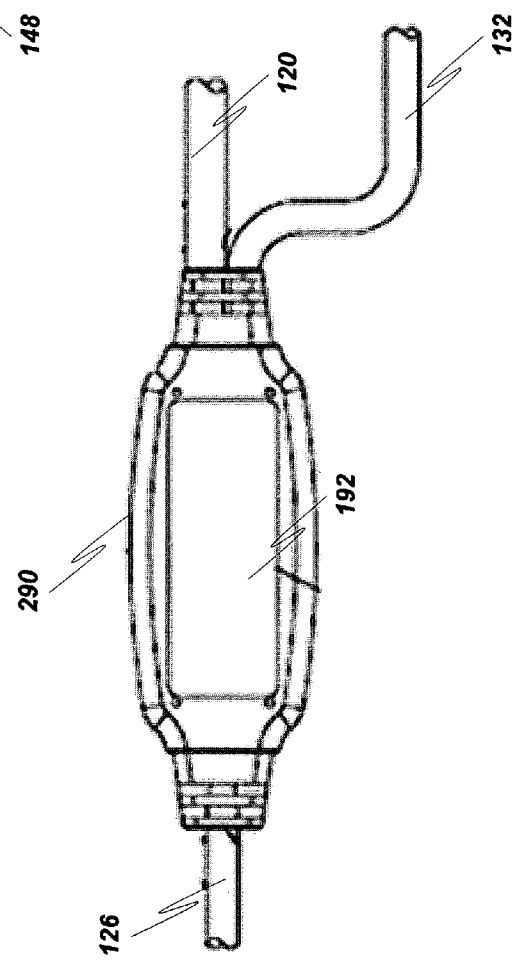

With all wires positioned in wire combs and with of the electrical connections made, the entire assembly may be overmolded. There are preferably two overmolds, an inner overmold, as shown in FIGS. 10(a)–10(b), and an outer overmold, as shown in FIGS. 10(c)–10(d). Preferably an LDPE resin is used for the overmolds. The outer overmold assembly preferably uses a UL rated 94V-0 PVC resin.

FIGS. 10(c)–10(d) show the structure of FIG. 3 following a molding step where a molded outer jacket or covering 290 has been formed so that it extends around and encloses the elements shown above and described in FIG. 3. The molded outer structure is an integral, one piece covering that also encloses the ends of cables 120, 148, 146 and 126 (in FIG. 10(c), cables 120, 126 and 132 in FIG. 10(d)). The molded jacket 290 is preferably comprised of an LDPE resin, and comprises an over-molded structure that is molded in place around the overmolded circuit board (FIGS. 10(a)–10(b)) and its connections, with the overmolded circuit board 192.

In presently preferred implementations, the molded encapsulation of circuit board, the wire combs, together with the cable ends preferably does not have a flashing that exceeds 4 mm at the cable jacket area. Similarly, the overmolded outer jacket 290 should have minimal pinched outer walls and minimal effects of heat distortion, and preferably does not exceed 6 mm from the inner mold wall.

In some presently preferred embodiments of the present invention, the interior dimensions of the molded cover 290 can be about 51 mm long, about 23 mm wide, and about 8.6 mm thick, and with a 4 mm flashing would be about 55 mm long. The outer dimensions of cover 290 will be longer, wider and thicker as may be desired, such as, for example, about 92 mm long, about 31 mm wide and about 14 mm thick.

Thus is described an improved wire mounting approach comprising use of a wire comb which, when mounted on a circuit board, will hold individual wires, space them apart a desired amount, hold them firmly in place, and permit the connecting (e.g., by soldering) of the individual wires to connections on the circuit board.

In some aspects, the present invention comprises a wire comb mounting structure that can be fabricated to be mountable on a circuit board, preferably adjacent to the wire contacts thereof. The wire comb according to embodiments of the present invention can have a variety of constructions, not only to accommodate wire placement needs for a particular circuit board, but also to accommodate the size, type and number of individual wires and/or cables being mounted to the circuit board.

The wire comb according to embodiments of the present invention can be formed to mount a signal individual wire or a plurality of individual wires, for example, three, six, eight or more. It is also within the scope present invention to use either a single wire comb or multiple wire combs, again depending upon the particular circuit board and the number of individual wires being mounted.

In some embodiments, a seven-gap wire comb is preferably used to hold seven wires from a VGA plug, whereas a six-gap wire comb is preferably used to hold three wires from each of a PS/2 mouse and keyboard connector; and a three gap wire comb is preferably used to hold three wires from a USB connector.

In addition, in other aspects, the present invention contemplates using wire combs on a variety of areas of a circuit board and on more than one side of a circuit board. The wire combs can be used on different parts or portions of the same side of a circuit board, as well as on opposite sides of circuit boards. The present invention also contemplates the use of multiple combs, and the use of combs in directly opposing positions on opposite sides of the board.

Wire combs according to embodiments of the present invention can have a variety of sizes, designs and/or arrangements. One embodiment includes eight openings spaced out across the width of the comb. The openings can be designed to frictionally hold individual wires, or alternatively permit the insulating cover to snap-fit into an opening. It is also contemplated to use an adhesive such as those previously noted above as well as fast drying adhesives.

In some other aspects, the present invention also contemplates a variety of openings in terms of location, spacing, size and shapes including as well single or multiple openings for engaging each wire.

In further aspects, the present invention further comprises encasing the circuit board and the cable mounted firmly in a molded outer casing or jacket that will be a sufficient size to cover the circuit board thoroughly forming the board and cables into a unitary molded assembly.

While the present invention has been described in detail and with reference to cable systems for use in KVM (Keyboard Video Mouse) systems. Those skilled in the art will realize that the invention is not limited to KVM cables or to cables for KVM systems.

Although the drawings show particular wires being connected to particular contacts, it will be immediately apparent to those skilled in the art that the wiring in any particular system will depend on the circuitry and its functions.

While the present invention has been described with respect to inline PCBs, those skilled in the art will realize and understand that the invention is not limit to such PCBs and can be used for fixed mounted circuit boards.

While the present invention has been described in detail, and with reference to specific embodiments thereof, it will be apparent to those skilled in the art of their various modifications and variations can be made in the manufacture and practice of the present invention without departing from the scope and spirit of the invention. Other embodiments, modifications and changes of the present invention will readily occur to those skilled in the art, from their consideration of the foregoing specification and the embodiments set forth, which should be considered as exemplary only. Accordingly, it is not desired to limit the invention to the exact construction and operation illustrated and described, and all the suitable modifications and equivalents should be considered to be within the scope of the invention as set forth in the following claims.

We claim:

1. A circuit board assembly comprising a board having upper and lower surfaces, opposing ends and side edges, at least one wire comb mounted on said upper surface and adjacent one end thereof, wherein at least one wire comb includes
    a base,
    at least one mounting pin extending outwardly from said base, and
    at least one wire mount area defined by a shaped opening that receives and holds a portion of wire, wherein the base overlies said circuit board and a plurality of spark gaps formed in the surface of said circuit board.

2. A method of manufacturing a cable system having an electronic circuit therein, the circuit being on a circuit board, the method comprising:
    attaching at least one wire comb to the circuit board;
    mounting the wire comb in a flush manner relative to the circuit board so that the wire comb overlies at least one spark gap formed in the circuit board thereby providing a seal over the at least one spark gap;
    inserting at least one wire into said at least one comb, and electrically connecting said at least one wire to said circuit board; and
    forming an over mold of said circuit board.

3. A circuit board assembly comprising a board having upper and lower surfaces, opposing ends and side edges, at least one wire comb mounted on said upper surface and adjacent one end thereof, a plurality of spark gaps formed in the circuit board adjacent at least one of the opposing ends and wherein the wire comb overlies said plurality of spark gaps wherein at least one wire comb includes
 a base,
 at least one mounting pin extending outwardly from said base, and
at least one wire mount area defined by a shaped opening that receives and holds a portion of wire.

4. The circuit board assembly of claim 3, wherein the at least one wire comb forms a chamber between the base and the circuit board at each of the plurality of spark gaps.

5. The circuit board assembly of claim 3, further including a plurality of wire combs mounted at spaced apart locations around side edges of the circuit board.

6. A method of manufacturing a cable system having an electronic circuit therein, the circuit being on a circuit board wherein the circuit board includes a plurality of spark gaps adjacent at least one end thereof, the method comprising:
 attaching at least one wire comb to the circuit board thereby providing a seal between the wire comb and the circuit board thereby protecting the spark gaps;
 inserting at least one wire into said at least one comb, and electrically connecting said at least one wire to said circuit board; and
 forming an over mold of said circuit board.

7. The method as in claim 2, wherein the step of forming of an over mold includes the steps of:
 forming a first over mold from a first molding material covering the circuit board and the at least one wire comb, and
 forming a second over mold from a second molding material covering at least the first over mold material.

8. The method of manufacturing as in claim 7, wherein the first and second molding materials comprise the same material.

9. The method of manufacturing as in claim 7, wherein the first and second molding materials comprise different materials.

10. The method as in claim 6, wherein the step of forming of an over mold includes the steps of:
 forming a first over mold from a first molding material covering the circuit board and the at least one wire comb, and
 forming a second over mold from a second molding material covering at least the first over mold material.

11. The method of manufacturing as in claim 10, wherein the first and second molding materials comprise the same material.

12. The method of manufacturing as in claim 10, wherein the first and second molding materials comprise different materials.

* * * * *